(12) United States Patent
Cherniski et al.

(10) Patent No.: US 6,867,362 B2
(45) Date of Patent: Mar. 15, 2005

(54) CABLE EXTENSION FOR REDUCING EMI EMISSIONS

(75) Inventors: Andrew M. Cherniski, Rescue, CA (US); Kevin Smith, Roseville, CA (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 0 days.

(21) Appl. No.: 10/383,412

(22) Filed: Mar. 7, 2003

(65) Prior Publication Data

US 2004/0173369 A1 Sep. 9, 2004

(51) Int. Cl.[7] ................................................. H01B 7/34
(52) U.S. Cl. .......................................... 174/36; 333/12
(58) Field of Search ................................. 174/36, 74 R, 174/74 A, 75 B, 76, 77; 333/243, 12; 336/90, 174, 175, 98

(56) References Cited

U.S. PATENT DOCUMENTS

| | | | |
|---|---|---|---|
| 4,347,487 A | 8/1982 | Martin | |
| 4,371,742 A | * 2/1983 | Manly | ......................... 174/36 |
| 4,499,438 A | 2/1985 | Cornelius et al. | |
| 4,503,284 A | 3/1985 | Minnick et al. | |
| 4,506,235 A | 3/1985 | Mayer | |
| 4,816,614 A | 3/1989 | Baigrie et al. | |
| 4,920,233 A | 4/1990 | Kincaid | |
| 4,929,195 A | * 5/1990 | Seidoh | ....................... 439/610 |
| 4,992,060 A | * 2/1991 | Meyer | ........................ 439/620 |
| 5,052,949 A | * 10/1991 | Lopata et al. | ............... 439/610 |
| 5,170,010 A | 12/1992 | Aldissi | |
| 5,262,591 A | 11/1993 | Aldissi | |
| 5,262,592 A | 11/1993 | Aldissi | |
| 5,287,074 A | * 2/1994 | Meguro et al. | ............... 333/12 |
| 5,313,017 A | 5/1994 | Aldissi | |
| 5,491,299 A | 2/1996 | Naylor et al. | |
| 5,505,637 A | * 4/1996 | Kramer et al. | ............... 439/610 |
| 5,628,653 A | 5/1997 | Haas et al. | |
| 5,716,236 A | * 2/1998 | O'Sullivan et al. | ......... 439/610 |
| 5,763,825 A | * 6/1998 | Gilliland | ....................... 174/36 |
| 5,831,210 A | * 11/1998 | Nugent | ........................ 174/27 |
| 5,848,914 A | * 12/1998 | Lang et al. | .................. 439/610 |
| 5,941,726 A | * 8/1999 | Koegel et al. | .............. 439/358 |
| 6,017,245 A | * 1/2000 | Karir | ........................... 439/610 |
| 6,054,649 A | * 4/2000 | Uchida et al. | ................ 174/36 |
| 6,158,899 A | 12/2000 | Arp et al. | |
| 6,210,216 B1 | * 4/2001 | Tso-Chin et al. | ............ 439/545 |
| 6,225,565 B1 | 5/2001 | Prysner | |
| 6,250,942 B1 | * 6/2001 | Lemke et al. | ............... 439/352 |
| 6,399,737 B1 | 6/2002 | Elkovitch | |
| 2002/0177357 A1 | * 11/2002 | Inui | ........................... 439/502 |

* cited by examiner

Primary Examiner—William H. Mayo, III

(57) ABSTRACT

A cable emission reduction apparatus includes a conductive cable core, a filter, and a cable shield. The conductive cable core extends longitudinally from a first end to a second end. The filter is coupled to and encases the conductive cable core, and extends longitudinally only a portion of the conductive cable core length, positioned between the first end and the second end. The cable shield is coupled to and encases the conductive cable core and the filter. The cable shield extends longitudinally from the first end over the filter and terminating prior to the second end.

20 Claims, 5 Drawing Sheets

CABLE EXTENSION FOR REDUCING EMI EMISSIONS

BACKGROUND OF THE INVENTION

Electromagnetic interference (EMI) can arise in any electronic system, either directly from circuitry or indirectly by conduction along connecting cables and by radiation. EMI can also arise from external sources to create problems in various systems. Undesirable signals occur whenever interference has a source, a receiver, and a transfer path. Accordingly, EMI can be reduced or eliminated by suppressing interference at the source, protecting the receiver against interference, and by reducing transmission.

Interference can propagate by radiation of electromagnetic waves in free space and by conduction on a conductive pathway. Techniques for suppressing radiant interference include shielding with conductive materials such as conductive adhesive tapes, wire mesh, and gaskets, or absorbing with absorbing materials such as carbon or ferrite-filled binders. Techniques for suppressing conducted interference include usage of ferromagnetic cable absorbers, connector backshields, filtered connectors, ferrite toroids, and feedthrough capacitors that all reduce emissions conducted onto connecting cables. Electromagnetic compatibility is regulated throughout the world. European Norms (EN) defines regulations applicable in all European Union (EU) and European Free Trade Associated (EFTA) countries. Federal Communications Commission (FCC) regulates electromagnetic compatibility in the United States.

Fundamentally, EMI should be addressed using good design practice to eliminate interference in design requirements. Design practice may be ineffective for interference that is directly related to inherent operating principles and for interference that is not detected until the final design phase. Additional suppression may be needed using extra suppression components such as ferrites, capacitors, or shielding elements.

A particular EMI emission difficulty is excessive radiated emissions originating from 10/100/1000 BaseT unshielded cable for cables connected to computer servers or other local area network (LAN) based equipment. Generally, LAN cable radiation can be the single most significant source of aberrant radio noise from servers and LAN devices. Common mode energy from non-LAN sources within a server often couples to LAN circuitry and is conducted to the outside environment through unshielded LAN cables.

Excessive radiation from LAN connectors and cables are generally addressed using three techniques. First, the offending noise source can be reduced inside the system enclosure of a LAN device, a technique that has several difficulties. The interior noise source can be hard to localize and, once localized, hard to remedy. Often an attempted fix will fail to accomplish significant noise reduction and can worsen the problem. An attempted fix that improves performance in prototype form can be ineffective when applied in a manufacturing setting. Due to the difficulty in detecting and treating a noise source or sources, numerous design or update cycles may be required to attain improvement. Attempts to reduce EMI inside the enclosure can deteriorate into a trial and error strategy that is impractical with a limited number of design cycles and large cost differentials of various fixes such as more robust system connectors and larger printed circuit board (PCB) layer counts. Addressing EMI inside the system enclosure presupposes that a design team will recognize the magnitude of the noise problem at time of conception and design, typically an incorrect presumption in practice.

Second, filters either integrated into connectors or on a system printed circuit board near LAN magnetics can limit the noise level, an approach that is generally limited by extreme consequences of LAN parametrics, resulting in a lack of commercially viable design choices. Furthermore, LAN magnetics vendors do not typically have the technological understanding to appropriately design filters capable of attenuating high frequency common mode noise.

Third, global usage of shielded LAN cables can avert LAN cable radiation but is economically prohibitive. To comply with the specification for every cable to be shielded, a customer would need to replace the entire LAN cable infrastructure with new and expensive shielded LAN cables, easily an expense of multiple thousands of dollars for relatively large customers.

SUMMARY OF THE INVENTION

In accordance with an embodiment of the described system, a cable emission reduction apparatus comprises a conductive cable core, a filter, and a cable shield. The conductive cable core extends longitudinally from a first end to a second end. The filter is coupled to and encases the conductive cable core, and extends longitudinally only a portion of the conductive cable core length, positioned between the first end and the second end. The cable shield is coupled to and encases the conductive cable core and the filter. The cable shield extends longitudinally from the first end over the filter and terminating prior to the second end.

In accordance with other embodiments, a cable extension comprises a partially shielded cable, a ferrite filter, a shielded connector, and a second connector. The partially shielded cable comprises interior conductive elements and cable shielding overlying the interior conductive elements. The partially shielded cable extends longitudinally from a proximal end to a distal end. The cable shielding begins at the proximal end and extends only part of the longitudinal cable length. The ferrite filter is coupled between the interior conductive elements and the cable shielding and is longitudinally positioned between the proximal end and the distal end. The shielded connector is coupled to the proximal end and has a connector shield electrically coupled to the cable shielding. The second connector coupled to the distal end and electrically isolated from the cable shield.

In accordance with other embodiments, a method of manufacturing a cable extension comprises acts of coupling a ferrite filter to an unshielded portion of a cable that is partially or completely unshielded and encasing the ferrite filter in a cable shield. The cable extends longitudinally from a proximal end to a distal end with the ferrite filter coupled at a selected position between the proximal end and the distal end. The cable shield combines with any shielding of the cable to form a substantially continuous cable shielding from the proximal end, overlying the ferrite filter to a position prior to the distal end. The method further comprises the acts of coupling a shielded connector to the proximal end of the cable, coupling a shield of the shielded connector to the cable shield at the proximal end, and coupling a second connector to the distal end of the cable, the second connector being left electrically uncoupled to the cable shield

BRIEF DESCRIPTION OF THE DRAWINGS

Embodiments of the invention relating to both structure and method of operation, may best be understood by referring to the following description and accompanying drawings.

DESCRIPTION OF THE EMBODIMENT(S)

What is desired is an EMI solution that allows usage of an existing cable infrastructure while complying with global standards for radiated emissions.

A cable extension can be coupled between a communicating device and a communication cable to eliminate or substantially reduce radiated emissions. In specific embodiments a local area network (LAN) cable extension can be coupled between a LAN device and a LAN cable to control EMI emissions. The cable extension comprises a cable with a first connector capable of coupling proximal to the communicating device and a second connector capable of coupling to the communication cable. A filter encases or surrounds the cable at a position between the first and second connectors. A cable shield encases or surrounds the filter and the cable in vicinity not encased by the filter. The first connector is shielded and couples to the cable shield. The second connector is isolated from the cable shield. The extension cable can be any length that attenuates EMI emissions to specification.

The shielded first connector is configured to be electrically connected to the enclosure of a system such as a computer system, storage system, server, or other suitable processing, communication, storage, or other system.

The cable extension can be a relatively inexpensive solution to excessive radiated emissions and can be implemented independent of equipment design and system configuration. The cable extension can be constructed using available components and construction processes.

Figure 1:
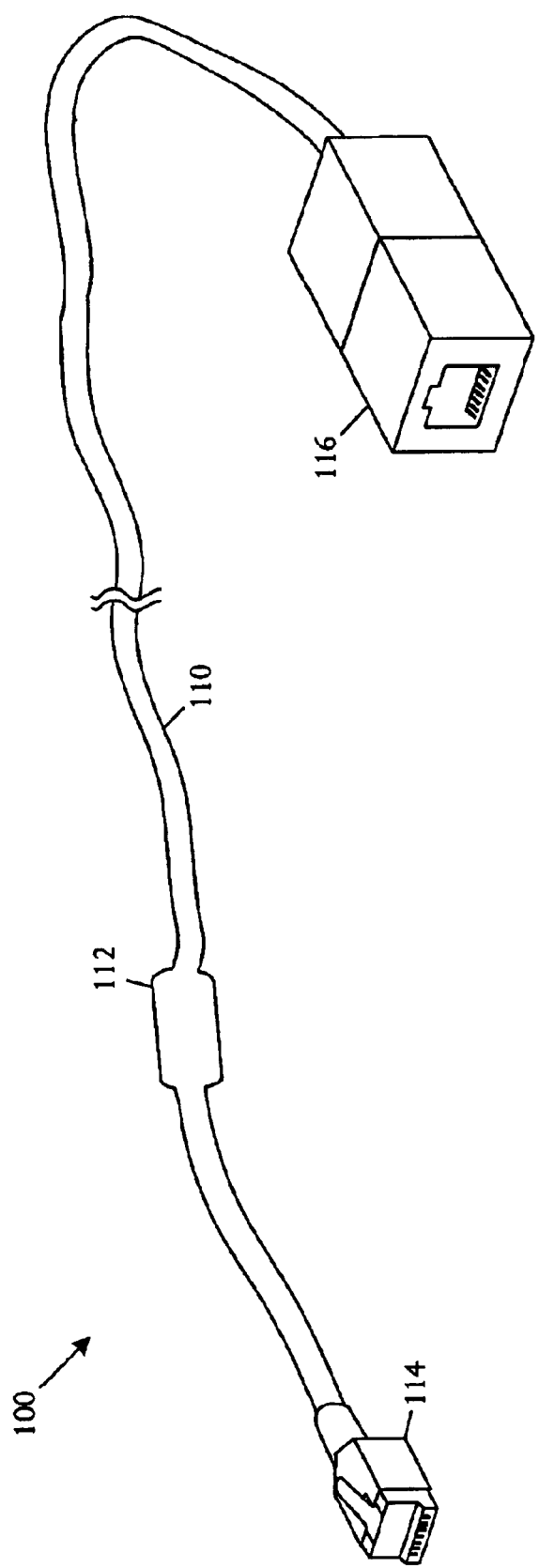
FIG. 1 is a pictorial diagram illustrating a perspective view of a cable extension example capable of eliminating or reducing electromagnetic interference emissions.

Referring to FIG. 1, a pictorial diagram illustrates an example of a cable extension 100 capable of eliminating or reducing electromagnetic interference emissions. The cable extension 100 can be coupled between a communicating device and a communication cable to eliminate or substantially reduce radiated emissions. In a particular example, the cable extension 100 is a local area network (LAN) cable extension that can be coupled between a computer server or other LAN equipment and a LAN cable to control EMI emissions.

In a suitable product configuration, the cable extension 100 comprises a cable 110 coupled between a first connector 114 and a second connector 116, and a filter 112 encasing a portion of the cable 110. The cable 110 can be any suitable communication cable or LAN cable. For example, suitable standard cables include CAT-5, CAT-5E, CAT-4, CAT-3, category 6-24 and 22 AWG cables, and the like. Other possible cable types include Myrinet-LAN, for example 18-twisted-pair, shielded, UL type CL-2 cables. In the illustrative example, the cable 110 is a shielded CAT-5 variety cable. The cable 110 can be any length capable of attenuating radiated emissions to a specified level, for example to a level that meets national and international standards, or that meets more stringent requirements of a manufacture or for a specific application. In an illustrative configuration, a relatively short cable extension 100, for example 5 feet, can be sufficient to attenuate unwanted noise signals. A longer cable extension 100 generally results in improved radiated emission attenuation. In some examples, applications, and embodiments, a cable extension 100 shorter than 5 feet may be sufficient to attain EMI attenuation specifications.

The cable extension 100 can be connected to LAN equipment either directly or indirectly via a cable or LAN spigot, an appliance that decodes data such as digital audio or video into analog form. Generally, the EMI-reducing or eliminating cable extension 100 is connected to a device or system that risks failing radiated emission standards in absence of the cable extension 100.

The cable extension 100 comprises the cable 110, a first connector 114 that can make the direct or indirect connection proximal to the LAN equipment, and a second connector 116 that typically couples to a LAN cable but in some applications may connect to another LAN device. The first 114 and second 116 connectors can be any suitable communication connectors. For example, suitable standard connectors include any suitable commercially available or custom design connectors such as RJ45, RJ11, RJ12, RJ14, 10c modular telephone, DEC, and other connectors so long as the connectors are compatible with the cable. In an illustrative embodiment, the first connector 114 is a commercially available, male RJ45 connector coupled at the proximal end of the cable extension 100. In the illustrative embodiment, the second connector 116 is a mass-terminated, female RJ45 connector.

The shielded first connector 114 is configured to be electrically connected to the enclosure of a system such as a computer system, storage system, server, or other suitable processing, communication, storage, or other system for reducing EMI emissions.

The filter 112 encases or surrounds an unshielded diameter of the cable 110 at a position between the first 114 and second connectors 116. More specifically, the filter 112 is located at a position suitably proximal to the first connector 114 to attain the specified emission attenuation. Typically, the filter 112 is positioned so that no more than about 10% of the cable length is between the filter 112 and the shielded first connector 114. In an illustrative embodiment, the filter 112 is positioned at a distance between one and four meters from the first connector 114. The filter 112 can be any suitable filter, for example a ferrite filter or cable shield. The filter 112 is selected according to frequency at which maximum attenuation is sought, core shape to conform to shape of the cable 110, attenuation and impedance level for optimal noise suppression, and characteristics such as impedance for operating conditions such as temperature and current level. For EMI suppression applications, the filter 112 is generally selected to optimize high frequency performance.

Figure 2:
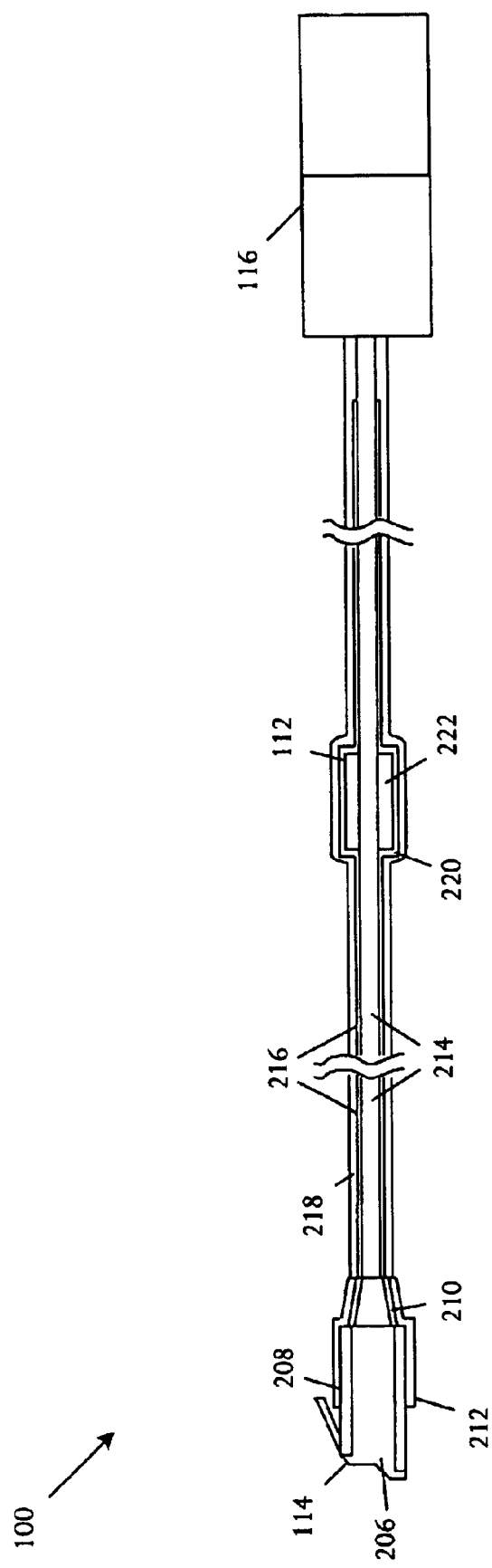
FIG. 2 is a pictorial diagram showing a longitudinal cross-sectional view of portions of the cable extension shown in FIG. 1.

Referring to FIG. 2, a pictorial diagram shows a longitudinal cross-sectional view of portions of the cable extension 100 shown in FIG. 1. In an illustrative cable extension 100, the cable 110 has an interior conductive cable core 214 that extends longitudinally from the first connector 114 to the second connector 116 and is located at the radial center of the cable 110. In a specific embodiment, the interior conductive cable core 214 can be unshielded, mutually insulated twisted pairs of data cables. Surrounding the interior conductive cable core 214 is a cable shield 216 such as a layer of metal foil or braid. Typically, the cable shield 216 can be constructed from copper, copper alloy, silver, silver alloy, and other suitable metals or materials. Other suitable shielding materials may include silver-coated aramid fiber braid, or other high-tensile fibers including nylon, nomex, and the like. Encasing the cable shield 216 is an insulating outer coating 218 that is typically constructed from various insulating plastics although other insulating materials can be suitable.

The first connector 114 is a shielded connector with a connector shield 210 enclosing conductive elements 206 within a connector casing 208. The first connector 114 is shown within an insulative boot 212. The cable shield 216 is coupled to the shielded first connector 114 with the cable shield 216 electrically coupled to the connector shield 210. Coupling of the cable shield 216 to the connector shield 210 can operate to contain signals, thereby reducing or eliminating EMI emissions.

At a suitable distance from the first connector 114, in some embodiments one to four meters, the filter 112 is attached to the cable 110 directly over the interior conductive cable core 214 and underlying the cable shield 216. The filter 112 is typically a ferrite filter 222, such as a rigid tubular structure that may be called a toroid or ferrite cable shield, or may be a flexible tube of ferrite-filled elastomeric binder as disclosed in U.S. patent application Ser. No. 10/383,387, entitled "Lossy Coating for Reducing Electromagnetic Emissions," invented by Andrew H. Dickson, filed on even day herewith, that is incorporated herein in its entirety.

The ferrite 222 radially overlies the interior conductive cable core 214, and radially underlies the cable shield 216. In some embodiments, the ferrite 222 can be installed on the cable 110 in an area where shielding has been removed over the interior conductive cable core 214 for a length equal to the length of the ferrite 222. The ferrite 222 can be mechanically secured in place directly over the interior conductive cable core 214, for example using glue or another fastener (not shown). The interrupted cable shield 216 can be replaced over the ferrite 222 as a replacement shield 220, fully surrounding the ferrite 222 and electrically connecting to the free and exposed ends of the cable shield 216. This illustrative technique for configuring the ferrite 222 over the interior conductive cable core 214 and beneath the cable shielding 216 is electrically equivalent to forcing a ferrite tube over an interior conductive cable core, but under a cable shield to a final destination without damaging the shield integrity.

In other embodiments, the cable 110 can be manufactured by supplying and threading an unshielded interior conductive cable core 214 into the central aperture of a ferrite ring 222 that fits tightly over the interior conductive cable core 214. The ferrite 222 is moved to a selected position on the interior conductive cable core 214. The interior conductive cable core 214 and ferrite 222 are covered with and encased by a cable shield 216. The cable 110 can be coated with an insulation sheath 218 that encases the cable shield.

In various other embodiments, the ferrite 222 can be positioned over an unshielded portion of the interior conductive cable core 214 such that the unshielded area does not precisely conform to the area covered by the ferrite 222. Although the unshielded area typically corresponds to the ferrite area, the unshielded area can be smaller than the ferrite coverage so that some of the ferrite 222 covers a portion of the cable shield 216.

The ferrite filter 112 can operate to raise the common mode impedance of noise signals without impacting differential signal impedance. The raised common mode noise impedance can be more effectively bypassed to ground through the remaining cable shield capacitance in the portion of the cable 110 beyond the ferrite 222.

In contrast to the first connector 114 that is shielded and couples to the cable shield 216, the second connector 116 is isolated from the cable shield 216. In the illustrative embodiment, the second connector 116 is a mass terminated, female, RJ45 connector that is neither shielded nor connects to the cable shield 216.

Figure 3C:
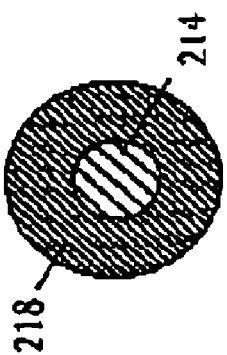
FIGS. 3A, 3B, and 3C are pictorial cross-sectional views of the cable depicting cable layers along the length of the cable extension in general, at the position of the filter, and in the vicinity of the second connector, respectively.
Figure 3B:
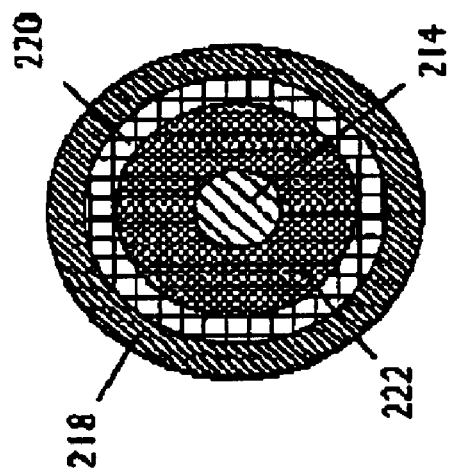
Figure 3A:
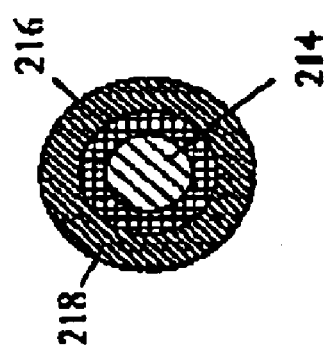

Referring to FIGS. 3A, 3B, and 3C, multiple pictorial cross-sectional views of the cable 110 depict cable layers generally along the length of the cable extension 100, at the position of the filter 112, and in the vicinity of the second connector 114, respectively. All portions of the cable extension 100 comprise the interior conductive cable core 214 and the insulating sheath 218. The cable shielding 216 extends over most of the cable extension 100 and is interposed between the interior conductive cable core 214 and the insulation 218 as shown in FIG. 3A. Proximal to the second connector 116, the cable shielding is omitted so that the insulation 218 can directly overlie the interior conductive cable core 214 as shown in FIG. 3C.

The ferrite 222 is configured overlying the interior conductive cable core 214 and replacement shielding 220 is formed overlying the ferrite 222 in the position of the filter 112 along the cable 110 as shown in FIG. 3B. The insulation 218 overlies the replacement shielding 220.

The cable extension 100 operates as a functional conduit capable of connecting an unshielded local area network within an office, company, or other enterprise with system resources of other network information. In many embodiments and applications, a cable extension 100 with a length of about five feet is commonly sufficient to attenuate unwanted emission signals, although various applications and systems may suitably utilize shorter and/or longer cable extensions.

An office or enterprise with multiple LAN cables can first pass signals through separate cable extensions 100 for every cable that interconnects components of a communication system or other network equipment to reduce or eliminate EMI emissions.

Figure 4:
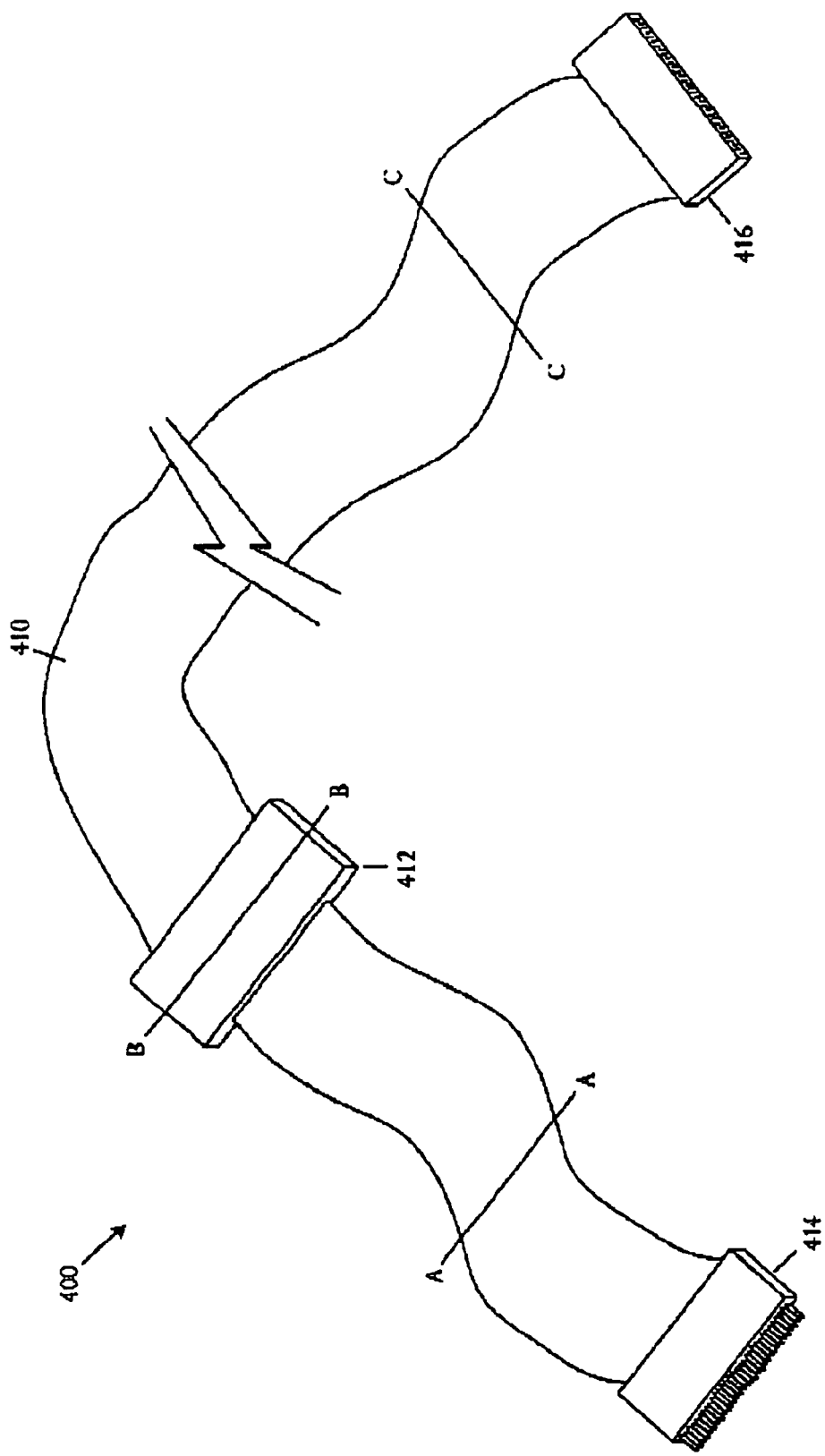
FIG. 4 is a perspective pictorial diagram illustrating an alternative embodiment of a cable extension 400 capable of reducing or eliminating EMI emissions.

Referring to FIG. 4, a perspective pictorial diagram illustrates an alternative embodiment of a cable extension 400 capable of reducing or eliminating EMI emissions. The cable extension 400 comprises a flat cable 410 that is shielded from a first end that can be coupled proximal to a LAN equipment device using a shielded proximal flat cable connector 414. The illustrative shielded connector 414 is a male shielded connector but may be a female shielded connector in other examples. A distal end of the flat cable 410 is coupled to a distal flat cable connector 416. The distal flat cable connector 416 is typically an unshielded connector but may be shielded in some examples. The illustrative distal connector 416 is a female connector but may be a male connector in other examples.

A filter 412 such as a ferrite filter is coupled to the flat cable 410 at a selected position near the shielded connector 414. The flat cable 410 is partially shielded with shielding electrically coupled to the shield in the shielded connector 414 and extending over the flat cable filter 412 to a position between the filter 412 and the distal connector 416. The distal connector 416 is electrically isolated from the cable shielding in the cable 410.

Figure 5A:
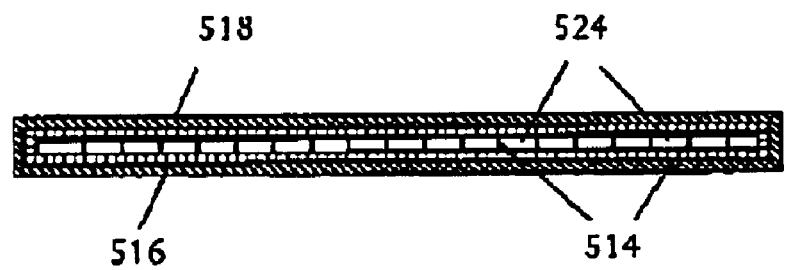
FIGS. 5A, 5B, and 5C are pictorial cross-sectional diagrams showing lateral sections of the cable.
Figure 5B:
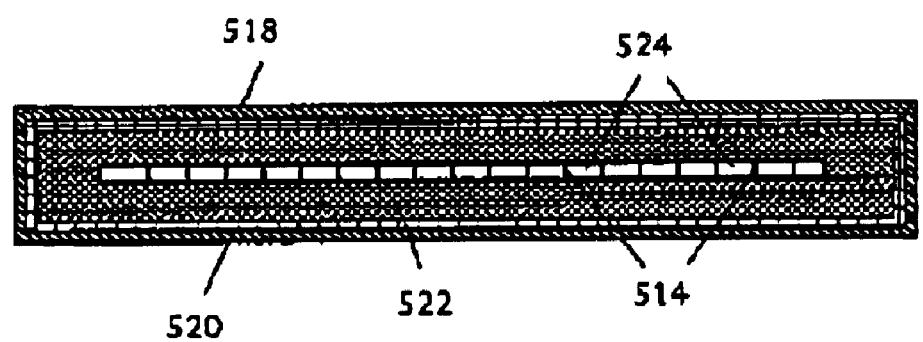
Figure 5C:
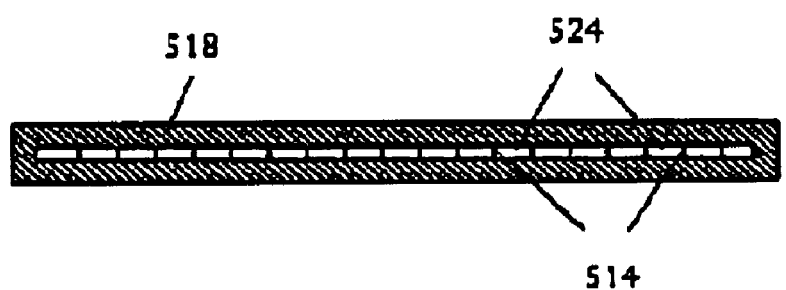

Referring to FIGS. 5A, 5B, and 5C, pictorial cross-sectional diagrams show lateral sections of the cable 410 at positions A, B, and C shown in FIG. 4. FIG. 5A shows layers of the flat cable 410 including interior conductors 514 and insulation 524 between the individual interior conductors. Cable shielding 516 overlies and underlies the interior conductors 514. An insulation layer 518 surrounds the cable shielding 516 and the interior conductor 514.

FIG. 5B shows the flat cable 410 with the ferrite filter 522 interposed between the interior conductors 514 and the cable shielding 520. In some embodiments, shielding overlying the ferrite filter 522 is a replacement shielding 520. FIG. 5C shows the cable cross-section in a position between the filter 412 and the distal connector 416 where the cable 410 is unshielded so that the distal connector 416 is electrically isolated from the shield 516.

While the invention has been described with reference to various embodiments, it will be understood that these embodiments are illustrative and that the scope of the invention is not limited to them. Many variations, modifications, additions and improvements of the embodiments described are possible. For example, various other cable types, either available under existing standards, custom cables, or cables that are developed in the future can be the basis for the described emissions reduction apparatus.

What is claimed is:

1. An apparatus for reducing cable emissions comprising:
   a conductive cable core that extends longitudinally from a first end to a second end;
   a filter coupled to and encasing the conductive cable core, the filter extending longitudinally only a portion of the conductive cable core length and positioned between the first end and the second end; and
   a cable shield coupled to and encasing the conductive cable core and the filter, the cable shield extending longitudinally from the first end over the filter and terminating prior to the second end.

2. An apparatus according to claim 1 further comprising:
   a shielded connector coupled to the first end of the conductive cable, the shielded connector having a shield electrically coupled to the cable shield.

3. An apparatus according to claim 1 further comprising:
   a connector coupled to the second end of the conductive cable, the second end connector being electrically isolated from the cable shield.

4. An apparatus according to claim 1 further comprising:
   an insulative coating coupled to the cable shield and encasing the cable shield, the filter, and the conductive cable core.

5. An apparatus according to claim 1 wherein:
   the filter is a rigid-walled ferrite filter.

6. An apparatus according to claim 1 wherein:
   the filter is a flexible structure formed of a ferrite-filled elastomeric matrix.

7. An apparatus according to claim 1 wherein:
   the length of the conductive cable core and the distance from the first end to the filter arc sufficient to reduce EMI emissions to a predetermined standard.

8. An apparatus according to claim 1 wherein:
   the conductive cable core is approximately five feet or longer and the distance from the first end to the filter is in a range from one inch to four meters.

9. A cable extension comprising:
   a partially shielded cable comprising interior conductive elements and cable shielding overlying the interior conductive elements, the partially shielded cable extending longitudinally from a proximal end to a distal end, the cable shielding beginning at the proximal end and extending only part of the longitudinal cable length;
   a ferrite filter coupled between the interior conductive elements and the cable shielding and longitudinally positioned between the proximal end and the distal end;
   a shielded connector coupled to the proximal end and having a connector shield electrically coupled to the cable shielding; and
   a second connector coupled to the distal end and electrically isolated from the cable shield.

10. A cable extension according to claim 9 wherein:
    the interior conductive elements comprise a plurality of twisted data cable pairs.

11. A cable extension according to claim 9 further comprising:
    an insulative coating coupled to and encasing the partially shielded cable.

12. A cable extension according to claim 9 wherein:
    the ferrite filter is a rigid-walled ferrite filter.

13. A cable extension according to claim 9 wherein:
    the ferrite filter is a flexible structure formed of a ferrite-filled elastomeric matrix.

14. A cable extension according to claim 9 wherein:
    the length of the partially shielded cable and the distance from the proximal end to the ferrite filter are sufficient to reduce EMI emissions to a predetermined standard.

15. A method of manufacturing a cable extension comprising:
    coupling a ferrite filter to an unshielded portion of a cable that is partially or completely unshielded, the cable extending longitudinally from a proximal end to a distal end, the ferrite filter being coupled at a selected position between the proximal end and the distal end;
    encasing at least the ferrite filter in a cable shield, the cable shield combining with any shielding of the cable to form a substantially continuous cable shielding from the proximal end, overlying the ferrite filter to a position prior to the distal end;
    coupling a shielded connector to the proximal end of the table,
    coupling a shield of the shielded connector to the ethic shield at the proximal end; and
    coupling a second connector to the distal end of the cable the second connector being left electrically uncoupled to the cable shield.

16. A manufacturing method according to claim 15 further comprising:
    supplying an unshielded cable;
    coupling the ferrite filter to the selected position on the unshielded cable;
    covering the unshielded cable and the ferrite filter with the cable shield from the proximal end to the position prior to the distal end.

17. A manufacturing method according to claim 15 further comprising:
    supplying a shielded cable;
    removing shielding from the shielded cable as the selected position and at the position prior to the distal end;

coupling the ferrite filter to the selected position on the unshielded cable;

covering the ferrite filter with the cable shield; and reconnecting the cable shield covering the ferrite filter to the cable shield on the cable adjacent the ferrite filter.

18. A manufacturing method according to claim 15 further comprising:

supplying a partially shielded cable with shielding removed at the selected position and at the position prior to the distal end;

coupling the ferrite filter to the selected position on the unshielded cable;

covering the ferrite filter with the cable shield; and reconnecting the cable shield covering the ferrite filter to the cable shield on the cable adjacent the ferrite filter.

19. A manufacturing method according to claim 15 further comprising:

selecting the cable length and the position of the ferrite filter to reduce EMI emissions to a predetermined standard.

20. A cable extension comprising:

a cable extending longitudinally from a proximal end to a distal end and comprising a plurality of interior conductive elements;

means coupled to the interior conductive elements and positioned at a selected location along the cable for increasing common mode impedance of a noise signal;

means overlying the common mode impedance increasing means the cable and extending from the proximal end to a position prior to the distal end for containing the noise signal;

means electrically coupled to the containing means for coupling the cable proximal end in proximity to a communication device; and means coupled to the cable distal end for coupling.

* * * * *